(12) United States Patent
Lutz et al.

(10) Patent No.: US 9,535,150 B1
(45) Date of Patent: Jan. 3, 2017

(54) METHOD FOR CALIBRATING A CABLE AND RESPECTIVE MEASURING DEVICE

(71) Applicant: Rohde & Schwarz GmbH & Co. KG, Munich (DE)

(72) Inventors: Thomas Lutz, Munich (DE); Matthias Lutz, Munich (DE); Jens Volkmann, Birnbach (DE); Albert Moser, Munich (DE); Kurt Schmidt, Grafing (DE); Ralf Plaumann, Forstern (DE); Gottfried Holzmann, Zorneding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/791,390

(22) Filed: Jul. 3, 2015

Related U.S. Application Data

(60) Provisional application No. 62/174,520, filed on Jun. 12, 2015.

(51) Int. Cl.
| | |
|---|---|
| *H04B 3/46* | (2015.01) |
| *H04B 17/00* | (2015.01) |
| *H04Q 1/20* | (2006.01) |
| *G01R 35/00* | (2006.01) |
| *H04L 12/26* | (2006.01) |

(52) U.S. Cl.
CPC ............ *G01R 35/005* (2013.01); *H04L 43/08* (2013.01); *H04L 43/50* (2013.01)

(58) Field of Classification Search
CPC ......... G01R 35/005; H04L 43/50; H04L 43/08
USPC ............................................. 375/224
See application file for complete search history.

(56) References Cited

U.S. PATENT DOCUMENTS

| | | | |
|---|---|---|---|
| 8,903,672 B2 | 12/2014 | Gregg et al. | |
| 2011/0136449 A1 | 6/2011 | Zhu | |
| 2011/0169502 A1* | 7/2011 | Reichel | G01R 35/005 324/601 |
| 2011/0301905 A1* | 12/2011 | Gregg | G01R 35/005 702/106 |
| 2014/0286382 A1* | 9/2014 | Dark | H04B 17/104 375/227 |

\* cited by examiner

*Primary Examiner* — Tanmay Shah
(74) *Attorney, Agent, or Firm* — Potomac Technology Law, LLC

(57) ABSTRACT

A measuring device comprises at least one port, an external cable connected to the at least one port, a transmitter connected to the at least one port through a switch, a receiver connected to the at least one port through the switch and a reference path connecting the transmitter with the receiver through the switch. The cable is connected to calibration elements, e.g., short and open. The switch alternately switch in a manner that in a first state the transmitter and the receiver are connected to the at least one port and that in a second state the transmitter and the receiver are connected via the reference path.

16 Claims, 7 Drawing Sheets

METHOD FOR CALIBRATING A CABLE AND RESPECTIVE MEASURING DEVICE

RELATED APPLICATIONS

This application claims the benefit of the earlier filing date under 35 U.S.C. §119(e) of U.S. Provisional Application Ser. No. 62/174,520 (filed 2015 Jun. 12).

FIELD OF THE INVENTION

Embodiments of the invention generally relate to calibration of cables of a measuring device such as mobile telephone testers, and to respective measurement devices, such as mobile telephone testers.

BACKGROUND OF THE INVENTION

Wireless electronic devices typically include transceiver circuitry, antenna circuitry, and other radio-frequency circuitry that provides wireless communications capabilities. During testing, wireless electronic devices under test (DUTs) can each exhibit different performance levels. For example, each wireless DUT can exhibit its own output power level, gain, frequency response, efficiency, linearity, dynamic range, etc. In an effort to take into account the radio-frequency cable path loss, a vector network analyzer (VNA) can be connected to each cable to determine its path loss. However, calibrating path loss using this approach requires a VNA and ignores path loss associated with the test fixtures and potential variations that may exist among the different test instruments in the different test stations. Failing to account for test fixture path loss and variations in the behavior of the different test instruments may result in inconsistent measurement data. For example, performance parameters measured using one test station may be offset with respect to the performance parameters measured using another test station.

In U.S. Pat. No. 8,903,672 B2, calibration equipment for calibrating multiple test stations in a test system is provided. Each test station includes a test unit, a test fixture and a radio-frequency (RF) cable that connects the test unit to the test fixture. A control test setup is used to calibrate uplink and downlink characteristics associated with each test station (e.g., to determine path loss associated with the RF cable and test fixture and variations associated with the test unit). The control test setup calibrates each test station at desired frequencies to generate a test station error (offset) table. The test unit of each test station is individually configured based on the test station error table so that offset is minimized among the different stations and so that the test stations may reliably measure hundreds or thousands of wireless electronic devices during product testing.

The cable loss of each test station is calibrated using a special control test set up. This special control test setup makes use of a calibration plate to be connected to the test fixture of each test station. This calibration setup, however, does not allow very accurate measurements and also slows down the calibration procedure.

There is a need, therefore, for an improved method for calibration and respective measuring devices allowing for calibration with sufficient accuracy.

SUMMARY OF THE INVENTION

Embodiments of the present invention advantageously address the foregoing requirements and needs, as well as others, by providing an improved method for calibration and respective measuring devices allowing for calibration with sufficient accuracy.

According to a first aspect an inventive method comprises connecting at least one port of a measurement device to a first calibration element, which may comprise, for example, a short via the respective cable. A signal from transmitter of the measurement device is submitted to the first calibration element through the cable and a measurement signal is measured as a return signal reflected by the first calibration element. The measurement is done by receiver of the measuring device. Also, a signal of the same frequency is submitted from the transmitter to the receiver through a reference path, which may comprise, for example, an internal path of the measuring device. A reference signal is measured through that reference path.

According to one embodiment, the measurement of the measuring signal and of the reference signal is done alternately several times. This sequence can be started with both, the measuring signal and the reference signal. By way of example, the measuring signal and the reference signal are each measured at least twice, and by way of further example, more than five times, and by way of yet a further example, more than ten times. By alternating the steps of measuring the measuring signal and the reference signal, the accuracy of the calibration can be significantly increased (which will be described in further detail below).

According to a further embodiment, the above procedures are performed for a second calibration element, which may comprise an open. The combination of an open and short calibration can be named in OS-calibration. By way of example, a short is embodied in a manner whereby the cable is terminated by a short at one end opposite to the end where the cable is fixed to the port of the measuring device. By way of further example, an open is embodied in a manner whereby the cable is open at the end opposite to the end where the cable is fixed to the port of the measuring device. According to yet a further embodiment, the above procedures are performed for a third calibration element, such as a match. By way of example, a match is embodied in a manner whereby the cable is terminated by a resistor which is matched to the system resistance of the cable, for example 50 Ohm or 75 Ohm. Such a calibration can be named an OSM-calibration, (open, short, matched).

Further, according to additional embodiments, the above steps can be repeated for several frequencies. For example, the frequencies can be stepped starting from a start frequency and ending at an end frequency with several frequencies in between. The frequencies in between can have an equal distance or another suitable distance such as a logarithmic distance.

By way of example, the measurement of the phase of the measuring signal and of the phase of the reference signal can be done before the magnitude of a measuring signal is measured. This is because the filters in the analog and digital signal processing need some time to work stable after the frequency has been changed (no more transient oscillation). During this period, however, the filters are already stable with respect to the phase but not necessarily also already with respect to the magnitude.

According to another aspect of the invention, a measuring device is provided. The measuring device comprises at least one port, a cable externally connected to the at least one port, a transmitter internally connected to the at least one port through a switch, a receiver internally connected to the at least one port through the switch, and a reference path, connecting the transmitter with the receiver through the switch. The switch alternately switches in a manner whereby in a first state the transmitter and the receiver are connected to the at least one port and that in a second state the transmitter and the receiver are connected via the reference path.

According to example embodiments, the cable is connected to a first calibration element and a second calibration element, wherein the first calibration element can be a short and the second calibration element can be an open. According to further embodiments, the cable can also be connected to a third calibration element, wherein the third calibration element can be a match. The third calibration element, however, is not explicitly necessary to achieve the advantages of example embodiments of the invention.

According to one embodiment, the measurement device comprises a signal splitter which is arranged between the switch and the at least one port. If there are several ports, there can be one signal splitter for each port or there can be a common signal splitter which is multiplexed to the several ports. By way of example, the signal splitter may comprise a resistive splitter, such as three resistors in a star configuration.

According to another embodiment, the receiver comprises a first selection device, configured to select first parts of the received signal vector, and a first phase averaging device configured to evaluate the averaged phase of the measuring signal. The measuring signal consists of the return signal reflected by the calibration element connected to the cable. According to a further embodiment, the receiver comprises a second selection device, configured to select second parts of the received signal vector, and a second phase averaging device configured to evaluate the averaged phase of a reference signal, which is the signal submitted by the transmitter to the receiver via the reference path. Additionally, according to a further embodiment, the receiver may also comprise a subtracting device configured to subtract the output of the second phase averaging device from the output of the first phase averaging device. The receiver may also comprise a magnitude (e.g., absolute value) averaging device configured to evaluate the averaged magnitude of the measuring signal. Further, the receiver may also comprise multiplier configured to multiply the output of the magnitude averaging device with an imaginary exponential output of the subtracting device.

By the before described approach, an effective and improved calculation of the cable loss is achieved, as is described in further detail by the below description of the detailed embodiments of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

In the figures of the drawings, example embodiments of the invention are depicted by way of example only, and not by way of limitation. In the drawings.

DETAILED DESCRIPTION OF THE INVENTION

Aspects of the present invention provide an improved method for calibration and respective measuring devices allowing for calibration with sufficient accuracy. Embodiments of the inventive method achieve improved calibration of the cable for a measuring device, such as a mobile phone testing device. While example embodiments are described with respect to a mobile phone testing device, however, it will be apparent that the approaches of embodiments of the present invention are also applicable to other types of measurement equipment, such as spectrum analyzer or oscilloscope.

According to example embodiments, such measurement devices are connected to the device under test (DUT) through cables. At high frequencies, above 1 GHz these cables have a significant damping even if kept as short as possible. The damping of the cables can be up to 12 dB. Thus, it is very important to calibrate the damping factor of the cables. The error of the result from this calibration procedure should be less than 1 dB. The cable is terminated by a short and a first calibration measurement is done with this short. Then the cable is terminated with an open and a second calibration measurement is done in this open configuration. This is done for several frequency points within the operation range of a measuring device.

According to such example embodiments, the measuring device comprises a transmitter and a receiver. By way of example, for mobile communication testers for testing mobile phones, the starting phase of the transmitter and of the receiver is different to the situation as calibrating the cable with a vector network analyzer because there is no coherence between the oscillators used for the mixers in the transmitter and the receiver. Thus, there is a need for measuring the start phase of the transmitter. According to example embodiments of the invention, a reference path can be alternatively switched between the transmitter and the receiver. By way of example, this may be accomplished by a switch. By way of further example, the reference path is arranged internally in the measuring device.

Figure 1:
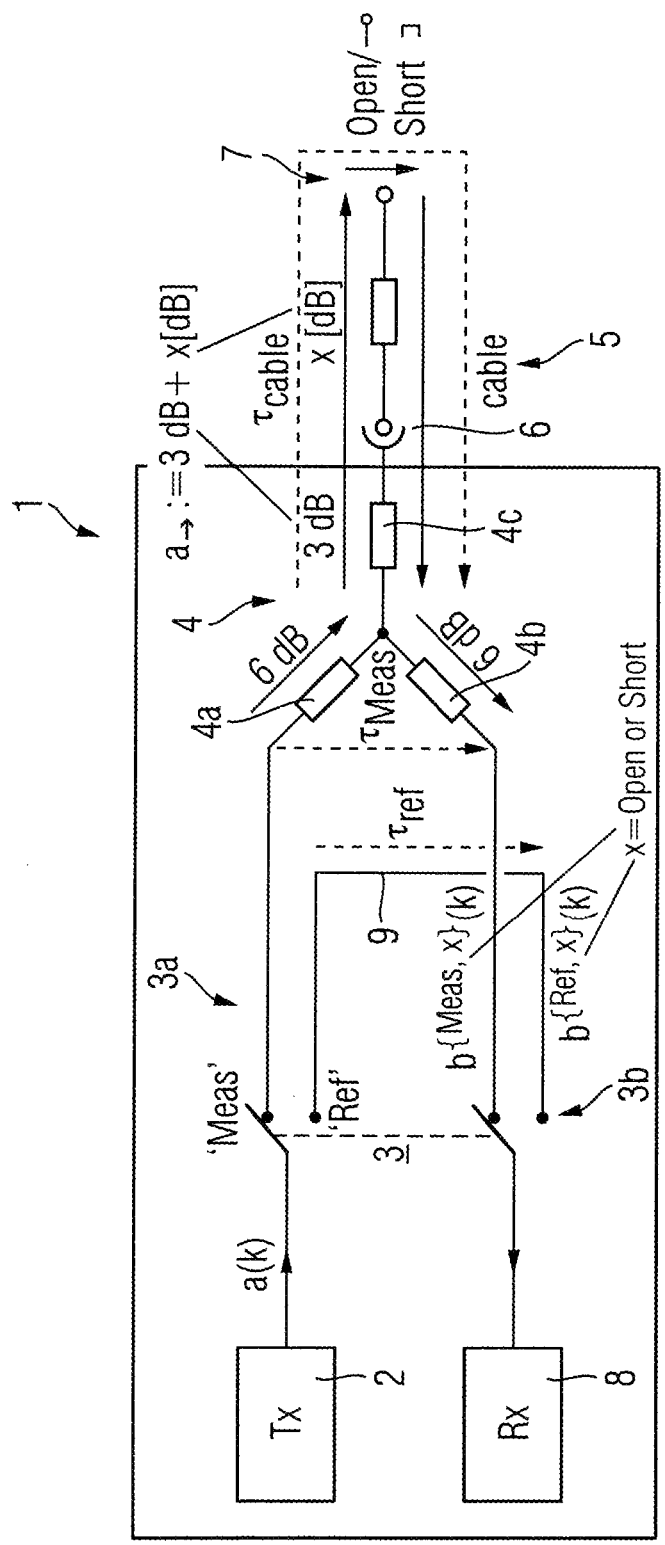
FIG. 1 illustrates a block diagram depicting an example measuring device and respective cables, in accordance with example embodiments.

FIG. 1 shows a block diagram of a simplified model of an embodiment of the inventive measuring device. In this block diagram, only the most essential elements in order to operate the present invention are shown. The model is shown in the equivalent base band which is sufficient to understand the present invention. All mixers and filters for up and down conversion are not shown. It is the task of the present invention to evaluate the unknown cable damping in a calibration procedure, wherein the cables are terminated by calibration elements, especially calibration standards such as open and short. The sending signal a(k) in the equivalent base band is described by the complex vector.

$$a(k) = \exp(j[\theta(k) + \theta_0]) + \overset{>=\theta}{\overline{n(k)}} \quad (1)$$

The symbols used in this formula describe the following: (i) $\theta(k)$ is a time dependent average free phase noise of the generator of the transmitter with respect to the phase of the oscillator of the receiver; (ii) $\theta_0$ is an arbitrary starting phase of the oscillator of the transmitter with respect to the oscillator of the receiver—for measuring with an open termination of the cable and for measuring with a short termination of the cable, these starting phases $\theta_0$ are different; (iii) n(k) is an Additive White Gaussian Noise (AWGN)—however, the phase noise is highly dominating the noise so that the AWGN is not considered any further here and is neglected in the above formula.

FIG. 1 shows a relatively simplified embodiment of the inventive measurement device. The embodiment is shown in the equivalent base band. Transmitter 2 transmit a complex sending signal a(k), which in the digital domain is defined at the samples points k, through the first part 3a of switch 3, through a signal splitter 4 and through a port 6 into the cable 5. Actually, this is the case at a first state "Meas" shown in FIG. 1. The cable 5 is terminated at the end 7 with a short in a first run and with an open in a second run. However, the cable 5 can also be terminated with other calibration elements, such as a match or a specific mismatch.

The wave is reflected at the open calibration element with no phase amendment and is also reflected at the short calibration element with a phase shift of 180°. The reflected wave will then propagate back through the cable 5 and through the other branch of the splitter 4 and through the second part 3b of the switch 3 into receiver 8. In the embodiment shown in FIG. 1, the signal splitter 4 is a resistive splitter having three resistors in a star configuration. A first resistor 4a is connected to the transmitter 2 through the first part 3a of the switch 3. A second resistor 4b is connected to the receiver 8 through the second part 3b of the switch 3. By way of example, in the first resistor 4a and the second resistor 4b, the wave receives a damping of 6 dB. A third resistor 4c is connected to the cable 5 through the port 6. By way of further example, the wave receives a damping in each direction (forward and backward) of 3 dB in the third resistor 4c, so that the wave in total is also damped by 6 dB in the third resistor 4c if the forward and backward directions are taken together. In the cable 5 the wave receives a damping of x dB in each direction. It is the task of a measurement to obtain a value of this cable damping x.

The path through the resistors 4a and 4b has a runtime of $T_{Meas}$ and has a damping of 12 dB. The signal through the port 6 has an additional runtime of $T_{cable}$ in the forward direction $$\overset{a}{\longrightarrow}$$

as follows:

$$a_{\rightarrow} = 3\ dB + x[dB] \quad (2)$$

x [dB] is the cable damping which is of interest here. The wave is additionally damped in the backward direction $$\overset{a}{\longleftarrow}$$

so that the wave running through the port has a total damping, as follows:

$$\overset{a}{\longleftrightarrow}$$

$$= 2 \cdot a_{\rightarrow}[dB] \quad (3)$$

In order to measure the unknown start phase $\theta_0$, the sending signal sent by the transmitter 2 is sent directly into the receiver 8 through a reference path 9. In this case, the switch 3 are in a second state designated "Ref".

In the following, it is shown that the unknown runtimes $T_{Meas}$ and $T_{cable}$ are not needed in order to evaluate the cable damping.

The open-measurement and the short-measurement are considered for an arbitrary frequency $\omega_v$. The sending signal has arbitrary starting phases and can be defined, as follows:

$$a(k) = \begin{cases} \exp(j[\theta(k) + \theta_0^{(Open)}]) @ \text{Open} \\ \exp(j[\theta(k) + \theta_0^{(Short)}]) @ \text{Short} \end{cases} \quad (4)$$

By the runtimes, the following phases are created:

$$\varphi_{Ref} := -\omega_v \cdot \tau_{Ref}$$

$$\varphi_{Meas} := -\omega_v \cdot \tau_{Meas}$$

$$\varphi_{Cable} := -\omega_v \cdot \tau_{Cable} \quad (5)$$

In the receiver 8 the following reference signal is received:

$$b^{(Ref,Open)}(k) = a(k) \cdot \exp(j\varphi_{Ref}) \quad (6)$$

$$= \exp(j[\theta(k) + \theta_0^{(Open)} + \varphi_{Ref}])$$

$$b^{(Ref,Short)}(k) = \exp(j[\theta(k) + \theta_0^{(Short)} + \varphi_{Ref}])$$

In the receiver 8 also the following measuring signal is received:

$$b^{(Meas,Open)}(k) = a(k) \cdot a_{12dB} \cdot \exp(j\varphi_{Meas}) \cdot \quad (7)$$

-continued $$= \exp(j[\theta(k) + \theta_0^{(Open)} + \varphi_{Meas}]) \cdot$$
$$a_{12dB} \cdot [1 + a_\leftrightarrow \cdot \exp(j\varphi_{cable})]$$

$$b^{(Meas,Short)}(k) = \exp(j[\theta(k) + \theta_0^{(Short)} + \varphi_{Meas}]) \cdot$$
$$a_{12dB} \cdot [1 - a_\leftrightarrow \cdot \exp(j\varphi_{cable})]$$

In an ideal case, the reference signal and the measuring signal are received simultaneously. This is assumed in the following as an assumption which makes it easier to understand the measurement principal. First of all, the unknown start phase $\theta_0$ is eliminated by measuring the reference signal. For the open-measurement we get:

$$c^{(Meas,Open)}(k) = b^{(Meas,Open)}(k) \cdot \exp(-j\arg\{b^{(Ret,Open)}(k)\}) \quad (8)$$
$$= \exp(j[\theta(k) + \theta_0^{(Open)} + \varphi_{Meas}]) \cdot a_{1MB} \cdot$$
$$[1 + a_\leftrightarrow \cdot \exp(j\varphi_{cable})] \cdot \exp(-j[\theta(k) + \theta_0^{(Open)} + \varphi_{Ret}])$$
$$= a_{12dB} \cdot \exp(j[\varphi_{Meas} - \varphi_{Ref}]) \cdot [1 + a_\leftrightarrow \cdot \exp(j\varphi_{cable})]$$

For the short-measurement we get:

$$c^{(Meas,Short)}(k) = b^{(Meas,Open)}(k) \cdot \exp(-j\arg\{b^{(Ret,Short)}(k)\}) \quad (9)$$
$$= \exp(j[\theta(k) + \theta_0^{(Short)} + \varphi_{Meas}]) \cdot a_{12dB} \cdot$$
$$[1 - a_\leftrightarrow \cdot \exp(j\varphi_{cable})] \cdot \exp(-j[\theta(k) + \theta_0^{(Short)} + \varphi_{Ret}])$$
$$= a_{12dB} \cdot \exp(j[\varphi_{Meas} - \varphi_{Ref}]) \cdot [1 - a_\leftrightarrow \cdot \exp(j\varphi_{cable})]$$

Figure 2:
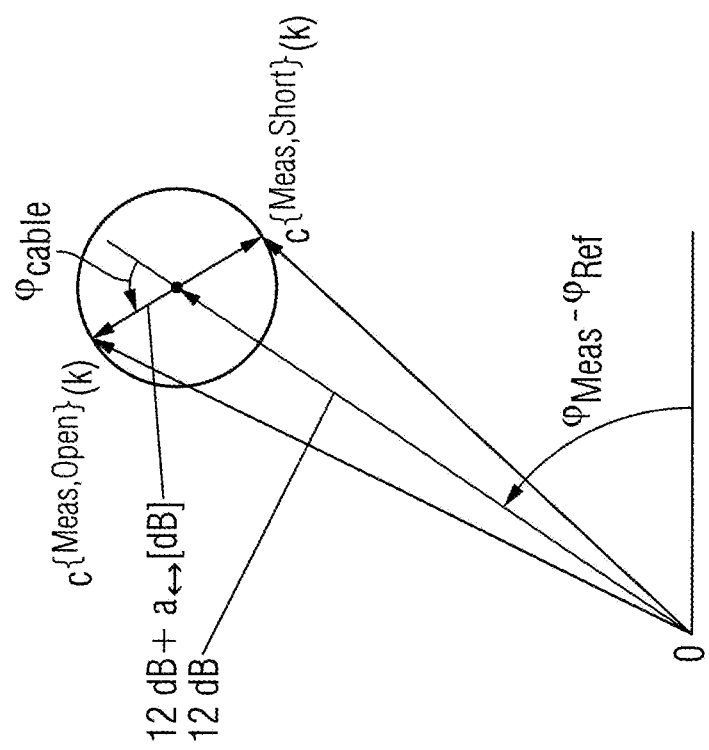
FIG. 2 illustrates a vector diagram depicting a quantitative evaluation of the cable loss according to example embodiments.

In FIG. 2, these vectors are shown graphically. From FIG. 2, it can easily be obtained that from both vectors the absolute value (magnitude) of the damping can be calculated. From the coefficient of these two estimated values, the damping in forward and backward direction can be obtained as follows:

$$\hat{a}_\leftrightarrow = \left| \frac{c^{(Meas,Open)}(k) - c^{(Meas,Short)}(k)}{c^{(Meas,Open)}(k) + c^{(Meas,Short)}(k)} \right| \quad (10)$$

By inserting this result into formulas (3) and (2), we receive the cable damping as follows:

$$\hat{x}[dB] = \frac{\hat{a}_\leftrightarrow[dB]}{2} - 3 \text{ dB} \quad (11)$$

In the embodiment of FIG. 1, all samples of the reference signal are measured first and then all samples of the measurement signal are measured or vice versa before the termination of the cable 5 is switched from short to open or vice versa. However, if this start phase shifts significantly in the meantime, there is a measurement error which can be significant. In the following, a second improved embodiment is described.

Figure 3:
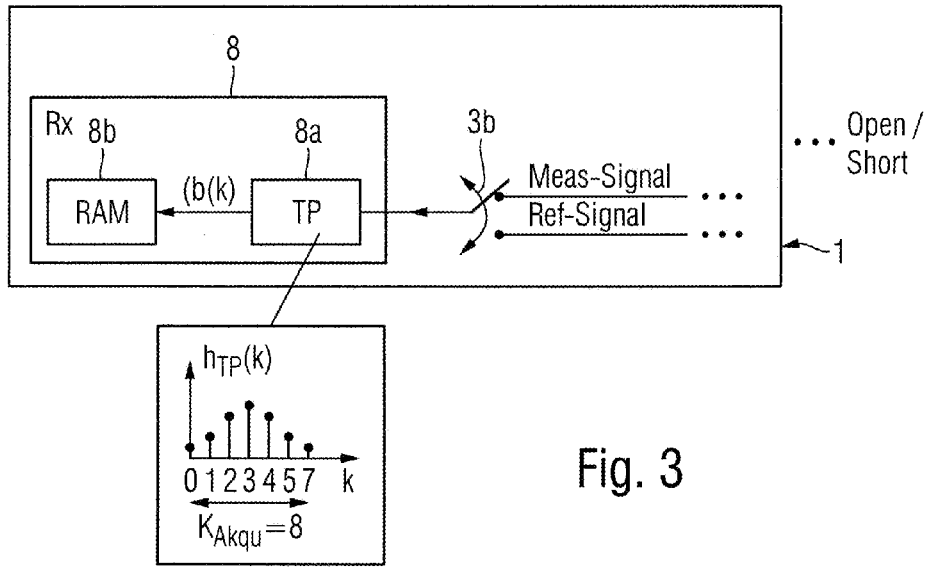
FIG. 3 illustrates a block diagram depicting a first example of the receiver (Rx) of a measuring device, in accordance with example embodiments.

In the improved embodiment shown in FIG. 3, the switch 3 are switched periodically so that the measurement of the samples of the measurement signal and of the reference signal is altered several times during the total measurement period. For receiver 8, a digital low pass 8a and storage device 8b are shown in FIG. 3. The other components are identical with the embodiment of FIG. 1. During the measurement, the switch 3 switch for a block length of $K_{Block} \cdot T_a$. After each switching, the low pass 8a of the receiver 8 with the impulse response $h_{TP(K)}$ need some time in order to stabilize (no transient oscillations anymore). As soon as the analog hardware is stabilized after switching, the acquisition of the measurement values b(k) can be started and can be stored into storage device 8b.

Figure 4:
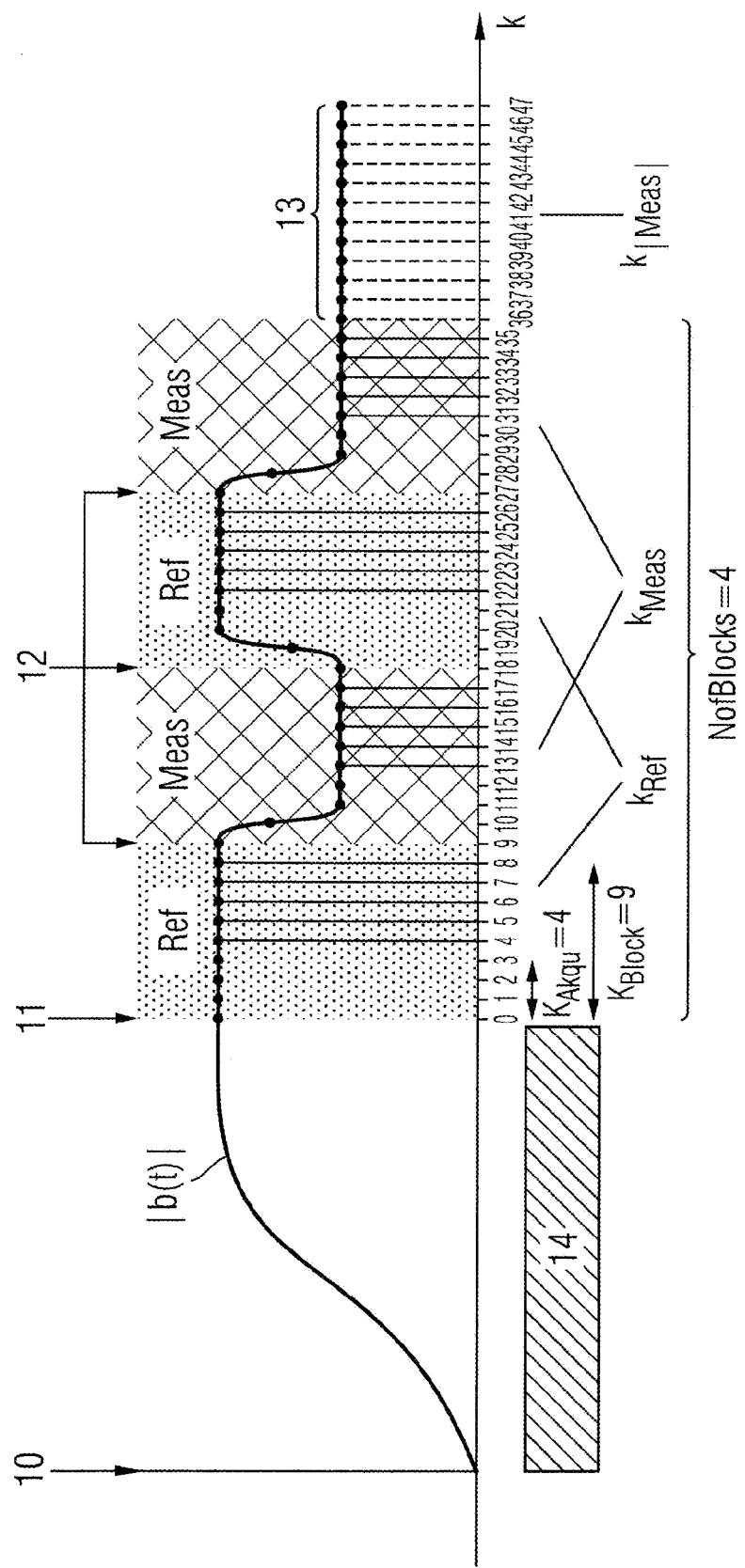
FIG. 4 illustrates the measurement of the reference signal and the measurement signal, and the measurement of the magnitude of the measurement signal, according to example embodiments.

FIG. 4 shows the timing of an open-measurement or a short-measurement at one single frequency point. The figure shows the magnitude |b(t)| of the signal received by the receiver 8. First of all, the analog hardware needs to stabilize on the new frequency point. Then the acquisition of the complex values b(k) starts, which are designated by respective dots in FIG. 4.

In the example shown in FIG. 4, the measurement starts with a group of samples of the reference signal of the block length of the $K_{Block}$. Then the measurement is switched in order to acquire a series of samples of the measuring signal of the same block length $K_{Block}$. The block lengths are identical in the embodiment shown but this does not necessarily need to be the case. When switching, in needs to be waited for a specific number of samples $K_{Alqu}$ during which the receiving low pass 8a is stabilizing, before valid samples can be used for the estimation of the cable damping.

The valid samples are designated by $K_{Ref}$ and $K_{Meas}$ in FIG. 4. These sample values are used in the following algorithm for estimating the magnitude of the cable damping. It can be possible that the analog hardware is not already stabilized when the samples of the measuring signal and the reference signal are already acquired. However, the stabilization time of magnitude is much longer than the stabilization time of the phase. Thus, the acquisition of values for the phase estimation can be started earlier than the acquisition of samples used for estimation of the magnitude. This will safe measurement time.

In FIG. 4, the label 10 designates the start of the measurement of a new frequency. The label 11 designates the start of the analog/digital-converter (ADC). The label 12 designates the switching point between measurement of the reference signal Ref and of the measuring signal Meas. As already mentioned, an additional area 13 may be present, wherein the digital filter and the analog hardware is stabilized and which is used for measuring the magnitude of the measuring signal Meas. In the area 14, the analog hardware generally stabilizes on the new measuring frequency. However, it may happen that the accuracy is not already sufficient to measure the magnitude of a measuring signal Meas. Thus, it makes sense to wait to the time area 13 in order to make magnitude measurements. $K_{|Meas|}$ are the time indices of the stabilized reference signal.

Now, the algorithm for the improved estimation of the cable damping is described. The variable x is used to distinguish between open and short. The input vector v_b comprises all samples b(k) of one measurement at one frequency. They are shown as dots in FIG. 4.

Figure 5:
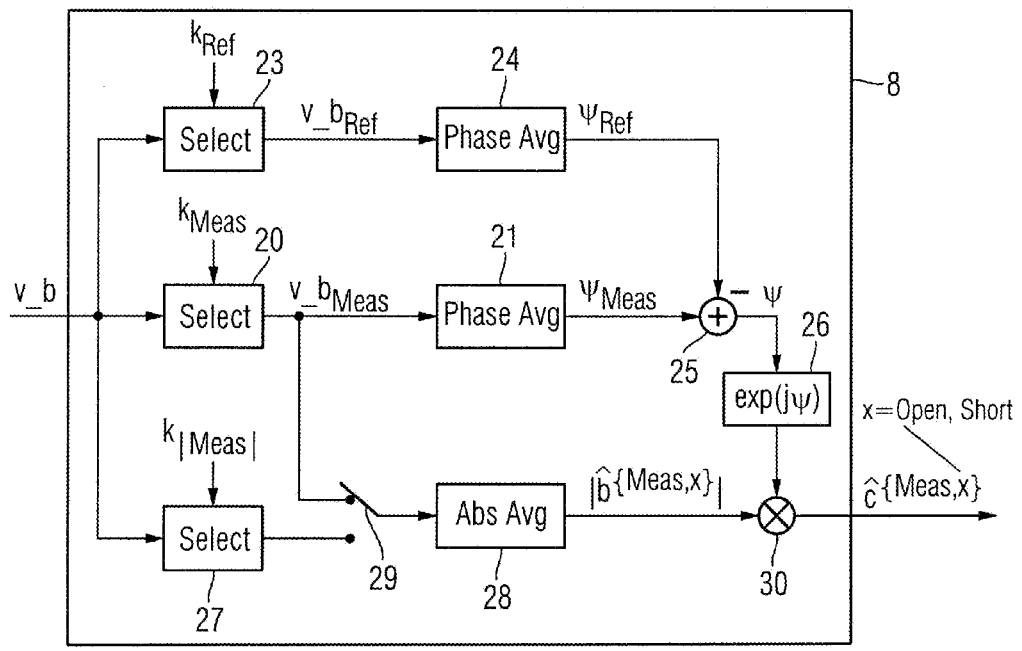
FIG. 5 illustrates a block diagram depicting a second example of the receiver (Rx) of a measuring device, in accordance with example embodiments.

FIG. 5 shows a block diagram of an embodiment putting the algorithm into practice. The vector v_b is submitted to first selection device 20 in order to select a first part $V\_b_{Meas}$ of the samples v_b of the measuring signal. The first selection device 20 is followed by first phase averaging device 21 in order to evaluate the averaged phase of the measuring signal $\Psi_{Meas}$. The receiver 8 also comprises second selection device 23 in order to select the samples v_b$_{Ref}$ of the reference signal. The second selection device 23 are followed by second phase averaging device 24. In order to evaluate the averaged phase of the reference signal $\Psi_{Ref}$, the phase values can be estimated as follows:

$$\Psi_{Ref} = \arg\{\hat{b}^{\{Ref,x\}}\}$$

$$\Psi_{Meas} = \arg\{\hat{b}^{\{Meas,x\}}\} \quad (12)$$

The phase difference $\Psi_{Meas} - \Psi_{Ref}$ is calculated in subtracting device 25. Exponential device 6 calculates an imaginary exponential value of the phase difference.

Further, the receiver 8 comprise third selection device 27 in order to select the sample values in the area 13 shown in FIG. 4 used for estimation of the magnitude of the measuring signal. The third selection device 27 are followed by magnitude averaging device 28 in order to evaluate the averaged magnitude $|\hat{b}^{\{Meas,x\}}|$ of the measuring signal Meas. In the embodiment shown in FIG. 5, there is a switch 29 in order to select between the values submitted by the first selection device 20 or by the third selection device 27. Thus, the magnitude can be calculated on the basis of the regular Meas values or by the special Meas values in the area 13 shown in FIG. 4 depending on the switch 29.

According to equations (8) and (9), the unknown start phase in the measuring signal Meas has to be eliminated by use of the reference-signal Ref using the equation:

$$\hat{c}^{\{Meas,x\}} = \hat{b}^{\{Meas,x\}} \cdot \exp(-j \arg\{\hat{b}^{(Ref,x)}\}) \quad (13)$$

By inserting equations (12) the following equation is achieved:

$$\begin{aligned}
\hat{c}^{(Meas,x)} &= |\hat{b}^{(Meas,x)}| \cdot \exp\left(j\arg\{\hat{b}^{(Measf,x)}\}\right) \cdot \exp\left(-j\arg\{\hat{b}^{(Ref,x)}\}\right) \quad (14) \\
&= |\hat{b}^{(Meas,x)}| \cdot \exp(j\psi_{Meas}) \cdot \exp(-j\psi_{Ref}) \\
&= |\hat{b}^{(Meas,x)}| \cdot \exp(j(\psi_{Meas} - \psi_{Ref})) \\
&= |\hat{b}^{(Meas,x)}| \cdot \exp(j\psi)
\end{aligned}$$

In order to do the multiplication in this equation, multiplier device 30 are available as shown in FIG. 5. By use of equation (10), the forward and backward damping can be achieved as follows:

$$\hat{a}_{\leftrightarrow} = \left|\frac{\hat{c}^{(Meas,Open)} - \hat{c}^{(Meas,Short)}}{\hat{c}^{(Meas,Open)} + \hat{c}^{(Meas,Short)}}\right| \quad (15)$$

By inserting the result into equation (11), finally the cable damping can be calculated as follows:

$$\hat{x}[dB] = \frac{\hat{a}_{\leftrightarrow}[dB]}{2} - 3 \text{ dB} \quad (16)$$

Figure 6A:
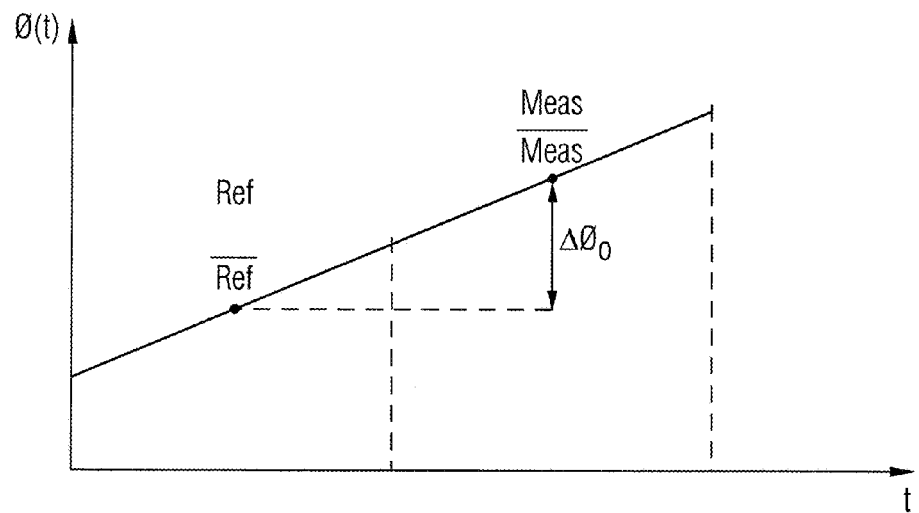
FIG. 6A illustrates a graph of the phase difference between the averaged reference signal and the averaged measurement signal, where the measurement of the referenced signal and the measurement signal is not done alternatively, in accordance with example embodiments.

FIG. 6A illustrates the measurement scenario of the first embodiment of the invention as shown in FIG. 1. In this basic embodiment, the measurement of the reference signal Ref, which has propagated through the reference path 9, and the measurement of the measuring signal Meas, which has propagated through the splitter 4, the port 6, the cable 5, has been reflected by the open or short and has propagated back through the cable 5, the port 6 and the splitter 4, is done in sequence. This means that all values of the reference signal Ref are measured first and then all values of the measuring signal Meas are acquired. If there is, however, a shift of the phase difference θ(t), which is a difference between the phase of the oscillator in the transmitter 2 and the phase of the oscillator of the receiver 8, then there is a significant measurement error as indicated in FIG. 6A.

In FIG. 6A, it is assumed that this phase shift θ(t) is linearly depending on time t. This assumption is done for a simplification. Of course, also other phase shift can occur. The average values Ref of the reference signal Ref and Meas of the measuring signal Meas are shown in FIG. 6A and it is clear from the drawing that the difference $\Delta\theta_0$ is quite high.

Figure 6B:
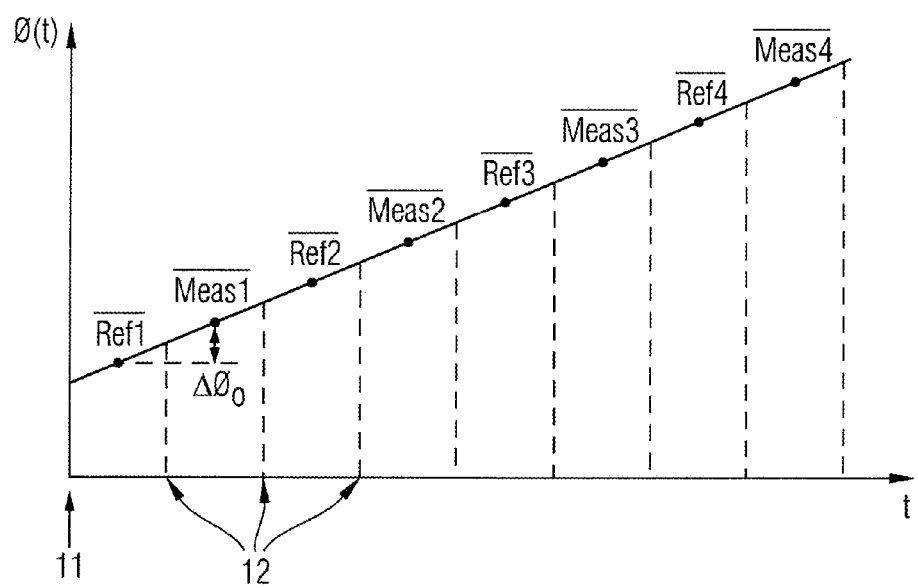
FIG. 6B illustrates the phase difference between the averaged reference signal and the averaged measurement signal, where the measurement of the referenced signal and the measurement signal is done alternatively, in accordance with example embodiments.

FIG. 6B shows the same situation but for the scenario of the improved embodiment of FIG. 3, FIG. 4 and FIG. 5. As explained previously, the main difference between the two embodiments is that in the improved embodiment, the measurement is always alternated between measuring of the reference signal Ref and measuring of the measuring signal Meas. The same linear phase shift is assumed. It is clear from FIG. 6B that the difference $\Delta\theta_0$ of the phase shift θ(t) is much smaller compared to the situation of FIG. 6A, because it is always switched between measuring of the reference signal Ref and of the measuring Meas.

Figure 7A:
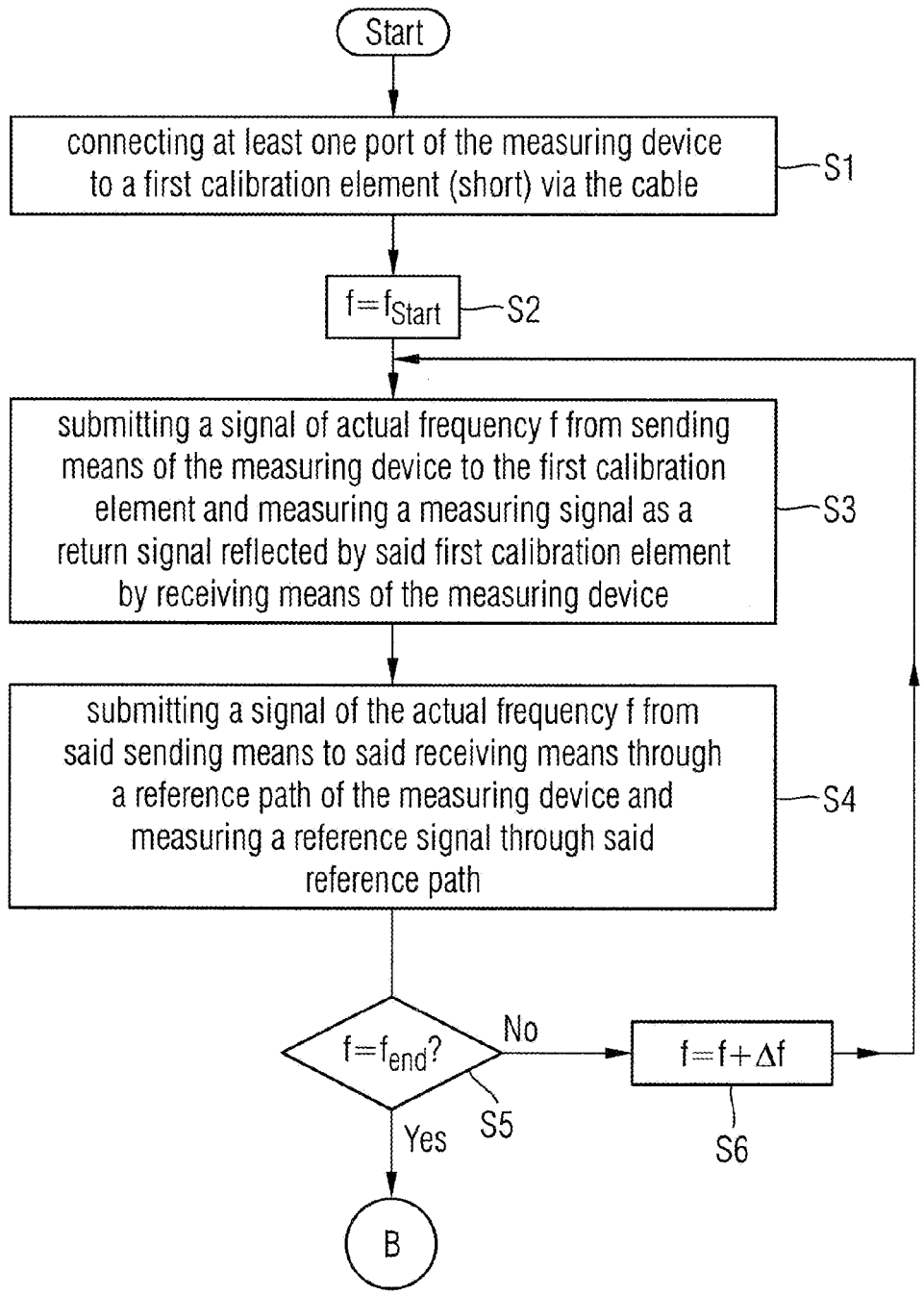
FIGS. 7A and 7B illustrate a flow chart a method, in accordance with example embodiments.

FIG. 7A shows a flow chart of a first part of the inventive method. In a first step S1, a first calibration element, such as a short, is connected to at least one port of the measuring device 1. The actual frequency f is set to the start frequency $f_{start}$ in step S2.

In step S3, a signal with the actual frequency f is submitted from the transmitter 2 of the measuring device 1 to the first calibration element and the measuring signal Meas as a return signal reflected by the first calibration element is measured by the receiver 8 of the measuring device 1.

In step S4, the signal of the actual frequency f is submitted from transmitter 2 to the receiver 8 through a reference path 9 of the measuring device 1 and the reference signal Ref is measured through the reference path 9. In step S5, it is checked, whether the actual frequency has reached the end frequency $f_{end}$. If not the actual frequency f is incremented by the incremental Δf in step S6 and the steps S3 and S4 are repeated as long as the actual frequency f reaches the end frequency $f_{end}$. If yes, the algorithm proceeds with the second part.

Figure 7B:
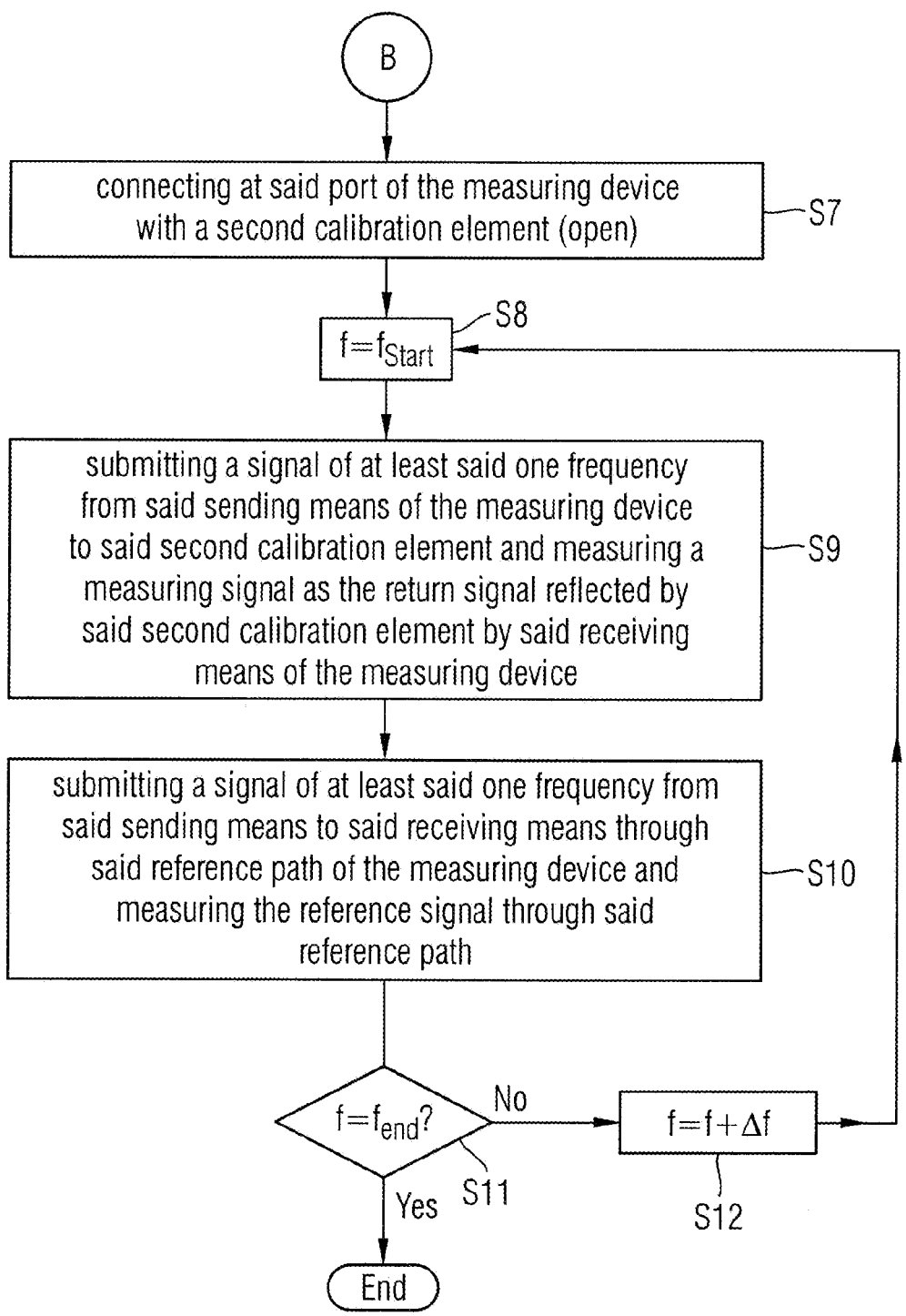

FIG. 7B shows the second part of an example, embodiment of the inventive method. In a step S7, a second calibration element, such as an open, is connected to at least one port of the measuring device 1. The actual frequency is set to start frequency $f_{start}$ in step S8.

In step S9, a signal with the actual frequency f is submitted from the transmitter 2 of the measuring device 1 to the second calibration element and the measuring signal Meas as a return signal reflected by the first calibration element is measured by the receiver 8 of the measuring device 1.

In step S10, the signal of the actual frequency f is submitted from transmitter 2 to the receiver 8 through a reference path 9 of the measuring device 1 and the reference signal Ref is measured through the reference path 9. In step S11, it is checked, whether the actual frequency has reached the end frequency $f_{end}$. If not the actual frequency f is incremented by the incremental Δf in step S12 and the steps S9 and S10 are repeated as long as the actual frequency f reaches the end frequency $f_{end}$. If yes, the algorithm ends.

There are several advantages of the inventive method and device. The cable damping can be obtained with very high accuracy. The cable damping can be obtained as a function of frequency. The damping values are directly available within the measuring device 1 and no external measurement such as with a vector analyzer needs to be done. Thus, the cable 5 does not need to be disconnected from the measuring device 1. No other measuring device such as a vector network analyzer, is necessary. Destroyed cables and connectors can be detected easily. When performing the calibration process, a circuit board comprising the short and open, and also the match, can be connected with a measuring device 1 instead of the device under test. The circuit board can have the same physical extensions and scalings as the device under test. Correction can be made at the transmission side. An approximation curve can be generated. Approximating values between the frequency values, for which the inventive measurement has been performed, can be created.

All features described in the above description, claimed in the following claims or drawn in the attached drawings can be combined within the scope of the present invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method comprising:
   providing a first signal, from a transmitter of a measuring device, to a first calibration element connected to a port of the measuring device via one or more cables;
   receiving, by a receiver of the measuring device, a first return signal reflected by the first calibration element, and measuring the first return signal;
   providing a second signal, from the transmitter to the receiver, through a reference path of the measuring device, and measuring a reference signal through the reference path; and
   wherein the measurement of the reference signal is performed via a signal splitter arranged between a switch and the port of the measuring device, wherein the signal splitter comprises a resistive splitter of a star configuration, and wherein a first resistor is connected to the transmitter through the switch, a second resistor is connected to the receiver through the switch and a third resistor is connected to a one of the cables through the port.

2. The method of claim 1, wherein the first calibration element is a short.

3. The method of claim 1, further comprising:
   providing a third signal, from the transmitter of the measuring device, to a second calibration element connected to the port of the measuring device;
   receiving, by the receiver of the measuring device, a second return signal reflected by the second calibration element, and measuring the second return signal;
   providing a fourth signal, from the transmitter to the receiver, through the reference path of the measuring device, and measuring the reference signal through the reference path.

4. The method of claim 3, wherein the second calibration element is an open.

5. The method of claim 3, wherein steps recited by claim 1 and the steps recited by claim 3 are alternately repeated a number of times.

6. The method of claim 3, wherein the steps are repeated for at least one different frequency for one or more of the first signal, the second signal, the third signal and the fourth signal.

7. The method of claim 1, wherein a magnitude and a phase of one or more of the first return signal and reference signal and the second return signal and reference signal are measured, and wherein the measurement of the phase is completed before the measurement of the magnitude.

8. A measuring device comprising a port;
   an external cable connected to the port;
   a transmitter connected to the port through a switch;
   a receiver connected to the port through the switch;
   a reference path connecting the transmitter to the receiver through the switch; and
   a signal splitter arranged between the switch and the port, wherein the signal comprised a plurality of resistors in a star configuration, with a first resistor connected to the transmitter through the switch, a second resistor connected to the receiver through the switch and a third resistor connected to the external cable through the port; and
   wherein the switch is configured to switch between states of the device, wherein in a first state the transmitter and the receiver are connected to the port and in a second state the transmitter and the receiver are connected via the reference path.

9. The measuring device of claim 8, wherein the switch is configured to alternately between the first state and the second state a number of times.

10. The measuring device of claim 8, further comprising:
    a first calibration element and a second calibration element, wherein the cable is terminated with the first calibration element and the second calibration element.

11. The measuring device of claim 10, wherein the first calibration element is a short and the second calibration element is an open.

12. The measuring device of claim 8, wherein the receiver comprises a first selection device and first phase averaging device configured to evaluate an averaged phase of a return signal reflected by a calibration element connected to the external cable.

13. The measuring device of claim 12, wherein the receiver further comprises a second selection device and a second phase averaging device configured to evaluate an averaged phase of a reference signal provided by the transmitter to the receiver via the reference path.

14. The measuring device of claim 13, wherein the receiver further comprises a subtracting device configured to subtract an output of the second phase averaging device from an output of the first phase averaging device.

15. The measuring device of claim 14, wherein the receiver further comprises a magnitude averaging device configured to evaluate an averaged magnitude of a measuring signal.

16. The measuring device of claim 15, wherein the receiver further comprises a multiplier device configured to multiply an output of the magnitude averaging device with an imaginary exponential output of the subtracting device.

* * * * *